(12) United States Patent
Laurent

(10) Patent No.: US 6,993,086 B1
(45) Date of Patent: Jan. 31, 2006

(54) HIGH PERFORMANCE SHORT-WAVE BROADCASTING TRANSMITTER OPTIMIZED FOR DIGITAL BROADCASTING

(75) Inventor: Pierre-André Laurent, Bessancourt (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/868,918

(22) PCT Filed: Jan. 5, 2000

(86) PCT No.: PCT/FR00/00009

§ 371 (c)(1),
(2), (4) Date: Jul. 11, 2001

(87) PCT Pub. No.: WO00/42710

PCT Pub. Date: Jul. 20, 2000

(30) Foreign Application Priority Data

Jan. 12, 1999 (FR) .................................. 99 00240

(51) Int. Cl.
H04L 27/04 (2006.01)

(52) U.S. Cl. .................................................. 375/295
(58) Field of Classification Search ............... 375/295, 375/298, 300, 308, 312, 314, 315; 455/102, 455/108, 109, 110; 332/101, 100, 103; 246/182 R
See application file for complete search history.

(56) References Cited

U.S. PATENT DOCUMENTS

| | | | |
|---|---|---|---|
| 3,801,732 A | * | 4/1974 | Reeves ........................ 380/222 |
| 4,027,261 A | | 5/1977 | Laurent et al. |
| 4,382,232 A | | 5/1983 | Laurent |
| 4,603,393 A | | 7/1986 | Laurent et al. |
| 4,656,440 A | * | 4/1987 | Gautschi ..................... 332/170 |
| 4,799,241 A | | 1/1989 | Laurent |
| 4,852,098 A | | 7/1989 | Brechard et al. |
| 4,888,778 A | | 12/1989 | Brechard et al. |
| 4,905,256 A | | 2/1990 | Laurent |
| 4,945,312 A | | 7/1990 | Auger et al. |
| 4,955,072 A | * | 9/1990 | Tomljenovic ............... 455/108 |
| 4,982,341 A | | 1/1991 | Laurent |
| 5,016,278 A | | 5/1991 | Rochette et al. |

(Continued)

FOREIGN PATENT DOCUMENTS

EP 0 482 502 4/1992

OTHER PUBLICATIONS

English Abstract of WO 98/26546, 1998.

*Primary Examiner*—Emmanuel Bayard
(74) *Attorney, Agent, or Firm*—Oblon, Spivak, McClelland, Maier & Neustadt, P.C.

(57) ABSTRACT

A short wave high efficiency radio broadcasting transmitter for digital transmissions. The transmitter includes a power tube in which the grid is excited by a variable phase signal through an excitation device and in which the anode is amplitude modulated by the output signal from a modulator. The phase and amplitude signals applied to the grid and anode of the tube respectively represent the phase and amplitude of the complex signal to be transmitted. The amplification characteristic of the excitation device remains linear for low amplitudes of the signal to be transmitted and operates under saturated conditions when the amplitude of the signal to be transmitted exceeds a given threshold value, so that the amplification characteristic of the transmitter as a whole remains linear independently of the amplitude of the signal to be transmitted. Such a transmitter may find particular application as a short wave transmitter.

20 Claims, 4 Drawing Sheets

U.S. PATENT DOCUMENTS

Figure 1:
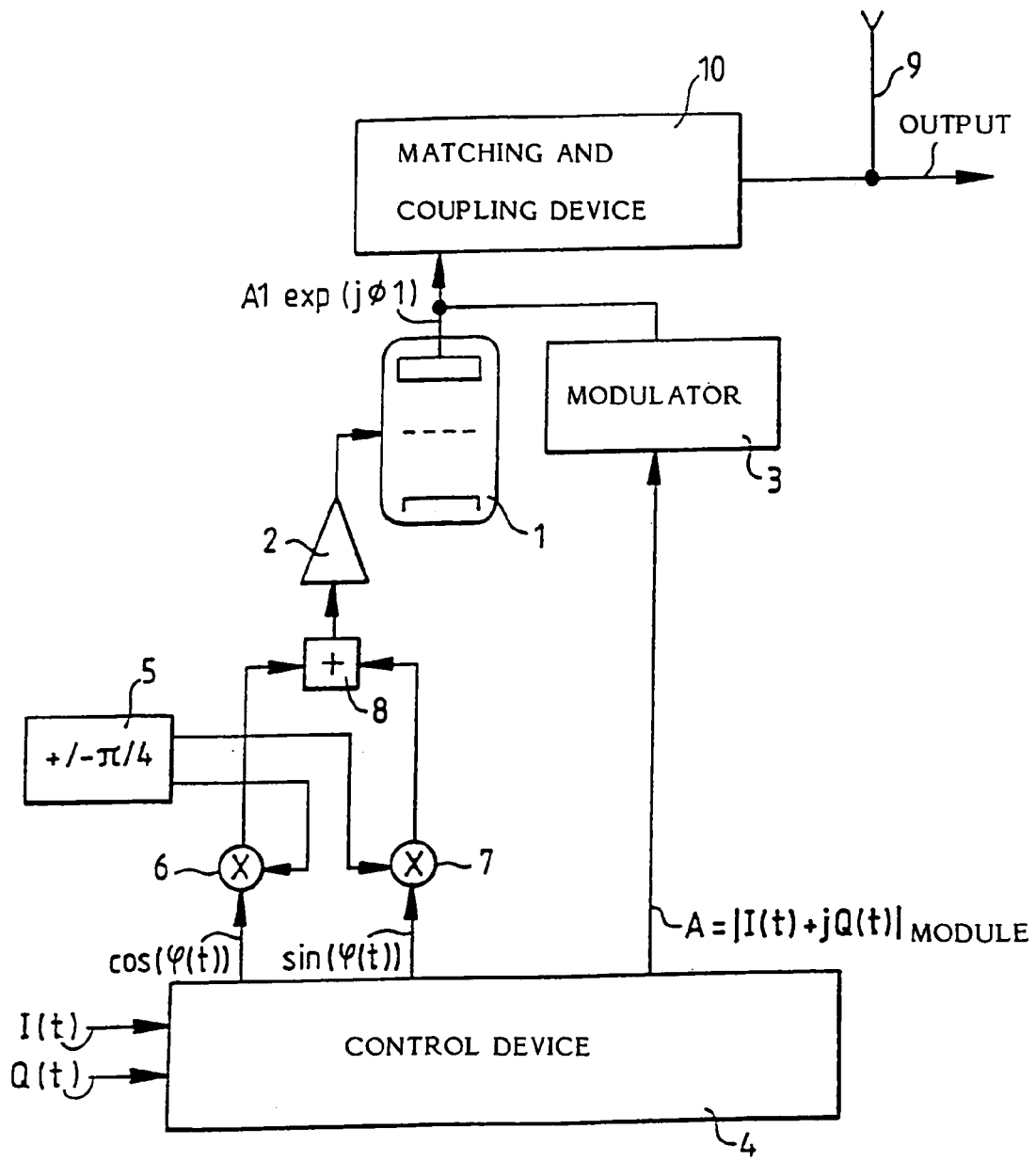

| | | | | |
|---|---|---|---|---|
| 5,074,499 A | * | 12/1991 | Marchand | 246/182 R |
| 5,243,685 A | | 9/1993 | Laurent | |
| 5,285,208 A | * | 2/1994 | Bertiger et al. | 342/352 |
| 5,313,553 A | | 5/1994 | Laurent | |
| 5,438,686 A | * | 8/1995 | Gehri et al. | 455/102 |
| 5,522,009 A | | 5/1996 | Laurent | |
| 5,903,188 A | * | 5/1999 | Swanson et al. | 330/10 |
| 6,016,469 A | | 1/2000 | Laurent | |

* cited by examiner

HIGH PERFORMANCE SHORT-WAVE BROADCASTING TRANSMITTER OPTIMIZED FOR DIGITAL BROADCASTING

CROSS-REFERENCE TO RELATED APPLICATIONS

This application claims priority under 35 U.S.C. 119 and the international convention to French application no. 99 00240, filed Jan. 12, 1999.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATION-BY-REFERENCE OF MATERIAL SUBMITTED ON A COMPACT DISK

Not applicable.

BACKGROUND OF THE INVENTION

1. Field of the Invention

This invention relates to a high efficiency radio-broadcasting transmitter optimized for digital type transmissions. It is applicable particularly to short wave radio broadcasting transmissions.

2. Description of Related Art

Radio broadcasting transmitters used at the present time for short wave transmissions are optimized to have a very high efficiency during transmission in pure amplitude modulation with carrier residue.

In order to achieve this, they are organized around a high power tube acting essentially as a current switcher at the rate of a carrier wave to be transmitted. A high voltage signal proportional to the instantaneous amplitude of the high frequency wave to be transmitted is applied to the anode tube through the output from a modulator. Modulations used at the present time are known as abbreviations IML and PSM.

With new digital radio broadcasting systems currently being standardized, the transmitted wave shape is not related to the audio frequency signal to be transmitted. It is of the type that is used in serial or parallel modulators. The binary stream that is transported depends on the coding of the audio frequency signal that is done on the input side, and the data that accompany it. The purpose of the process is to significantly improve the intrinsic reception quality of audio frequency signals and to make them insensitive to unwanted effects that occurred during propagation and are due mainly to fading, noise and interference phenomena, provided that they remain limited to reasonable values.

Another advantage of the process is that there is no need to transmit a carrier wave, although the carrier wave represents up to 90% of the total transmitted power in amplitude modulation transmitters. Furthermore, with a digital modulation process with a serial or parallel modulator, the transmitted signal is modulated both in amplitude and in phase. It is a complex signal, usually described by the relation $S(t)=1(t)+j\,Q(t)$, where $1(t)$ is the phase signal and $Q(t)$ is the quadrature signal. This makes it possible to consider using a conventional amplitude modulation transmitter in which a frequency reference is modulated in phase and in which the input audio frequency signal is proportional to the modulus of the complex signal to be transmitted.

Tests carried out up to now on this type of transmitter show that although the transmitted signal quality can be considered as being sufficient for reception, it is insufficient for an operational system that will need to cohabit with other transmitters, regardless of whether they are amplitude or digital modulation signals.

Even if the precaution of transmitting a carrier residue is taken in order to make operation of transmitter performances linear in terms of distortion, pass band and neutralization, the result is that the parasite transmissions in channels adjacent to the channels used by the transmitter are too high.

Defects with this type of transmitter are essentially due to the fact that the signal to be transmitted has all the characteristics of Gaussian or quasi Gaussian noise at its usual location, in other words close to the origin for $I=0$ and $Q=0$, whereas this is precisely the location at which difficulties are greatest.

The phase varies fastest when the signal passes close to the origin, which automatically makes it necessary to have a wide passband for the phase modulated channel.

Furthermore, there are also sharp direction changes in the amplitude channel close to the origin, which also need a wide passband of the amplitude channel, typically equal to at least three times the bandwidth of the transmitted signal.

However, the main concern of transmitter manufacturers is efficiency, which is usually given priority over linearity and phase distortion due to the approximate neutralization of the output tube.

Therefore the problem with the transmission of a digital type signal cannot be solved by simply adding control signals on existing transmitters. It requires the design of appropriate transmitters, however their efficiency must be acceptable for the operator and they must also be able to continue to transmit in pure amplitude modulation if necessary, in at least one transient phase.

For example, it would be possible to consider solving this problem when using a class A transmitter, in other words for which the transmission tube operates under unsaturated conditions, or to use the solution of transmitters known as DOHERTY transmitters.

A class A transmitter may be considered as being a pure amplifier in which the input is modulated by a low level high frequency signal and that outputs a high level replica of the input signal on its output, that is directly injected into the transmitter antenna system.

Unfortunately, apart from its deplorable efficiency of between 20 and 25% maximum, this system cannot be used for the main reason that there is no power tube within the useable 100 kW class, since the tubes are optimized to operate in class C in which energy efficiency is optimal.

DOHERTY type transmitters use two coupled tubes operating in a high efficiency mode. For illustration, a 90 kW transmitter of this type marketed by RCA is still in operation in the Vatican radio broadcasting station. This transmitter comprises two symmetric phase modulated tubes, and an output formed by a combination of the outputs from the two tubes which is exclusively amplitude modulated, however with a residual phase modulation that is not perceptible to existing receivers on the market. In this case too, this assembly is dedicated to radio broadcasting in amplitude modulation with carrier residue. But economically it is not very attractive, since it requires the use of two transmitter output power tubes.

BRIEF SUMMARY OF THE INVENTION

The concept on which the invention is based is to agree to reduce the global efficiency of the transmitter for low amplitude signals while maximizing efficiency for higher amplitude signals which cause a greater energy consumption.

This objective is achieved by modifying the excitation device of the transmitter power tube grid such that the behavior of the transmitter is variable as a function of the signal level applied to the transmitter input.

According to the invention, the excitation device behaves like a simple linear amplifier when the signal to be transmitted is low amplitude, and works in saturated mode when the amplitude of the signal to be transmitted is significant.

Under these conditions, the operating point of the transmitter power tube and its anode voltage are adjusted such that:

- at low amplitudes, the anode voltage is constant and is not too weak so that the power tube operates linearly or quasi-linearly, behaving like an amplifier of the output signal from the excitation device which also acts like an amplifier,
- at higher amplitudes, the anode voltage is modulated proportionally to the modulus of the signal to be transmitted.

The purpose of the invention is to use a transmitter satisfying these criteria.

Consequently, the purpose of the invention is a digital signals radio broadcasting transmitter comprising a power tube in which the grid is excited by a variable phase signal through an excitation device and in which the anode is amplitude modulated by the modulator output signal, the phase and amplitude of the signals applied to the grid and the anode of the tube respectively being representative of the phase and amplitude of a complex signal to be transmitted, characterized in that the excitation device has a linear amplification characteristic for low signal amplitudes to be transmitted and operates under saturated conditions when the signal amplitude to be transmitted exceeds a given threshold value, such that the amplitude characteristic of the transmitter as a whole remains linear independently of the amplitude of the signal to be transmitted.

The main advantage of the transmitter according to the invention is that it is simple to apply and only modifies the exciter of the power tube of standard transmitters if the power tube is not sufficiently linear.

Another advantage is that it provides a simple solution to the requirement for linearity of the transmitter for low level signals applied to the transmitter input, the operating point of the output tube being displaced such that the amplification of the output tube is linear or quasi-linear.

In principle, the global efficiency of the transmitter remains high since most of the time it works in the same way as in conventional solutions, in other words like a switch. The efficiency only also starts to drop when the power consumed is low.

Constraints on the passband of the amplitude modulator are lower since the amplitude of the output signal always keeps a minimum determined value and does not have any sharp direction changes widening the pass band.

The same is true for the exciter input modulator that no longer needs a wide passband, since its amplitude is very low or even zero when the signal passes close to the origin.

Another advantage is that the approximate linearity of the transmission system, both in amplitude and in phase, may easily be corrected after an initial and possibly periodic calibration phase to determine the exact values of the Im(t), Qm(t) and A(t) signals to be sent to the complex exciter input modulator and to the amplitude modulator.

Finally, the transmitter according to the invention can transmit any wave shape from pure digital to standard amplitude modulation, including hybrid versions simultaneously transmitting arbitrary proportions of the pure digital signal, the carrier residue with an arbitrary level and frequency, analog audio frequency signal in amplitude modulation, in single side band or in attenuated side band.

BRIEF DESCRIPTIONS OF THE SEVERAL VIEWS OF THE DRAWINGS

Figure 2:
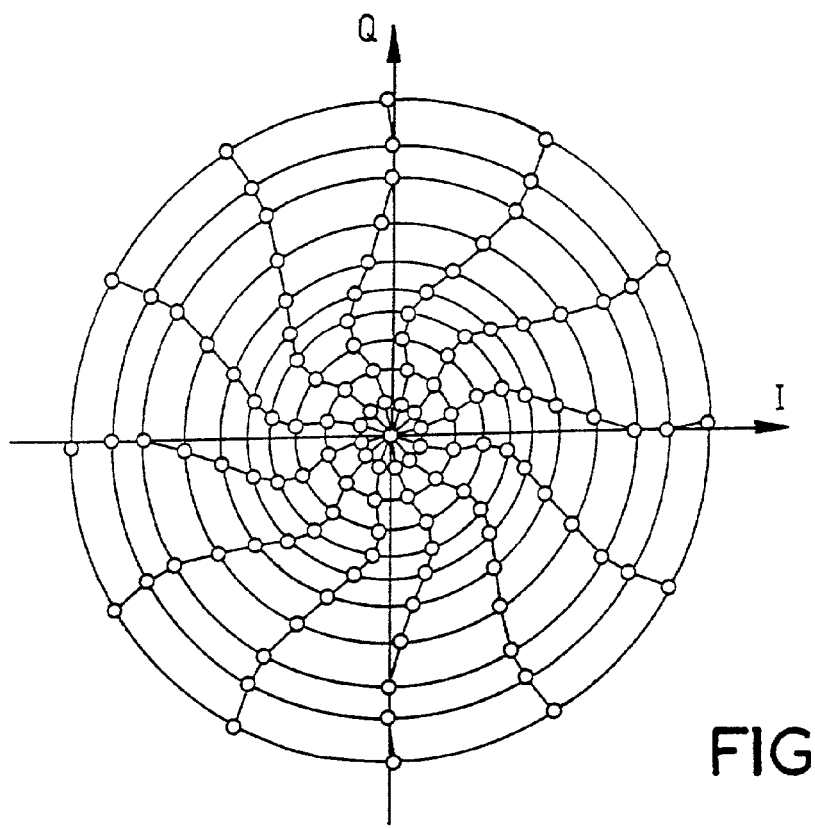
Figure 4:
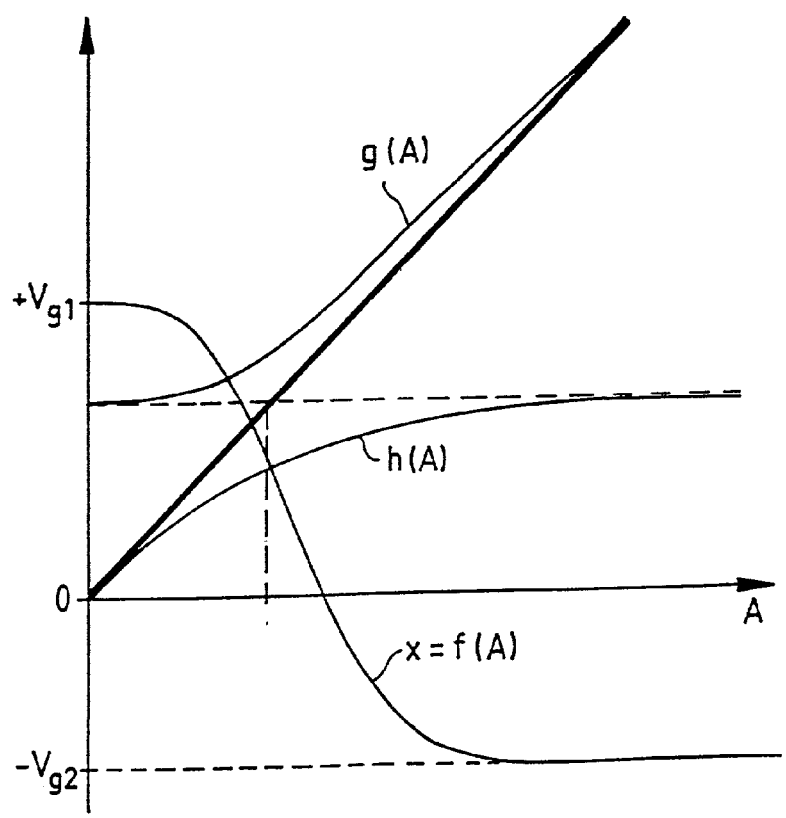
Figure 3:
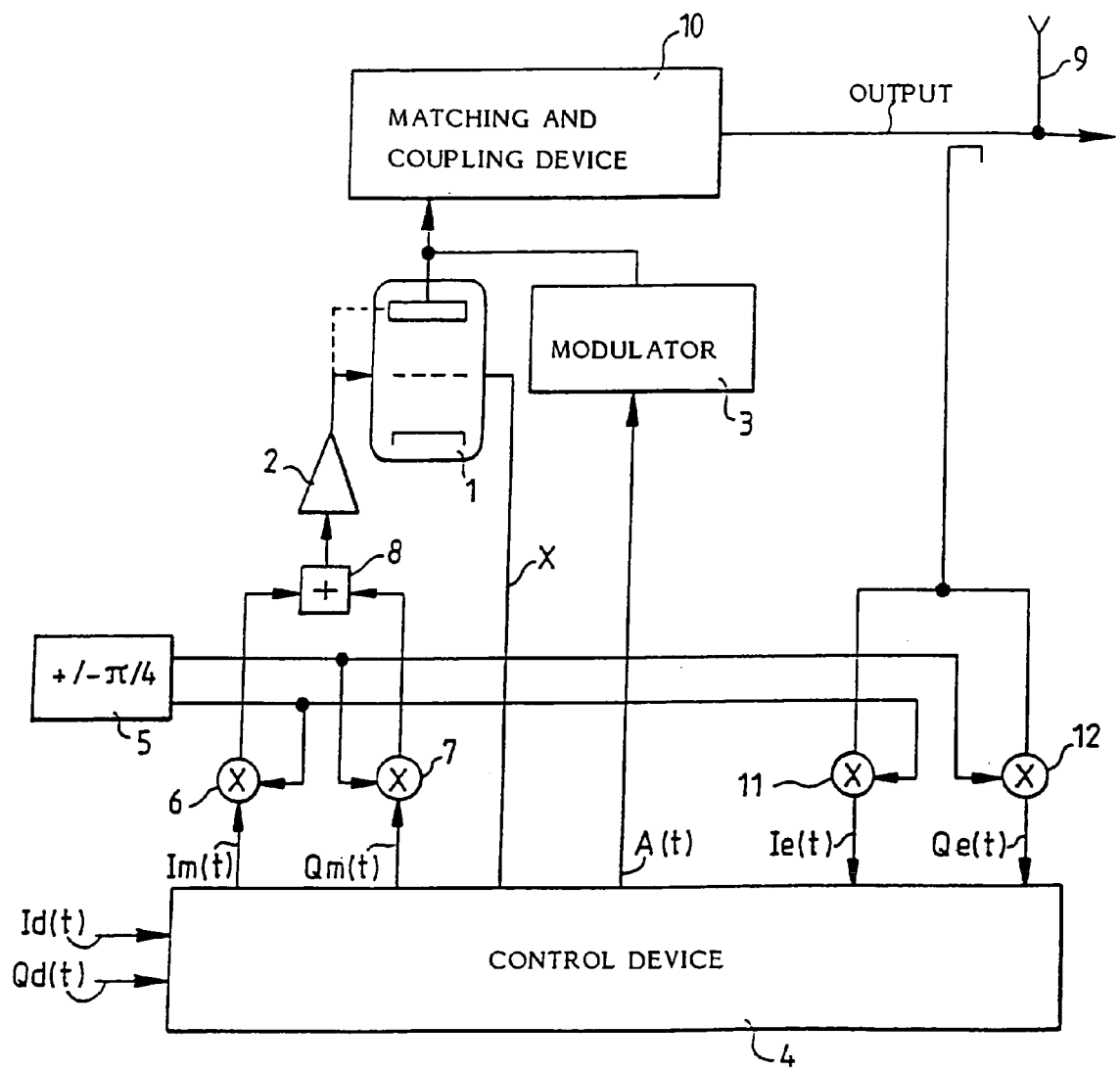
Figure 5:
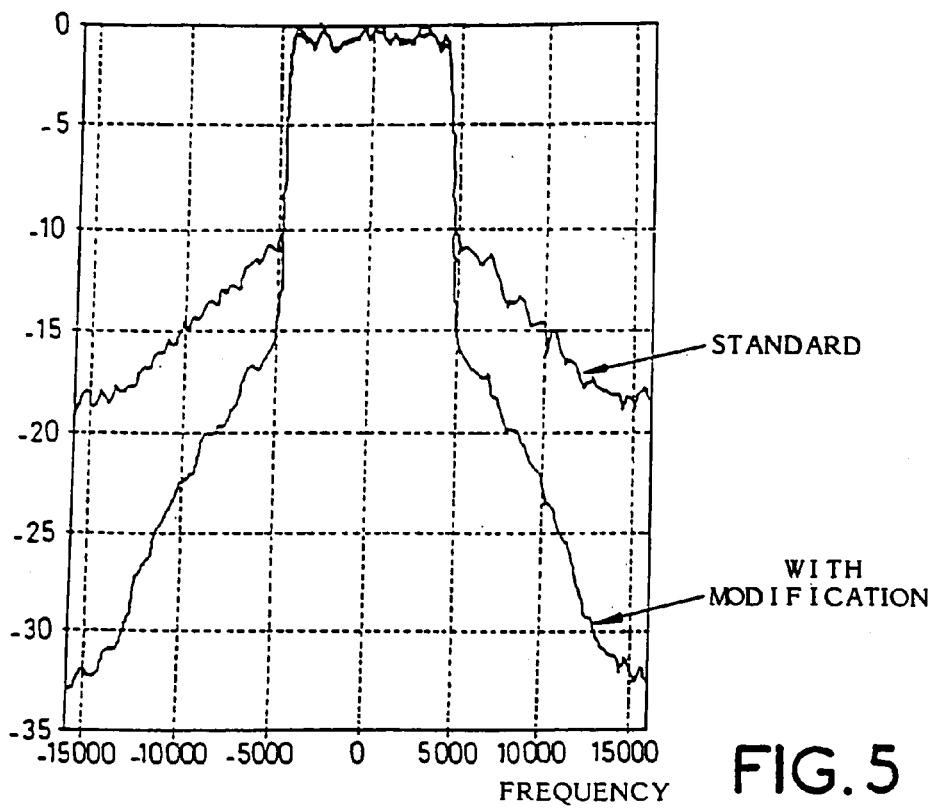
Figure 6:
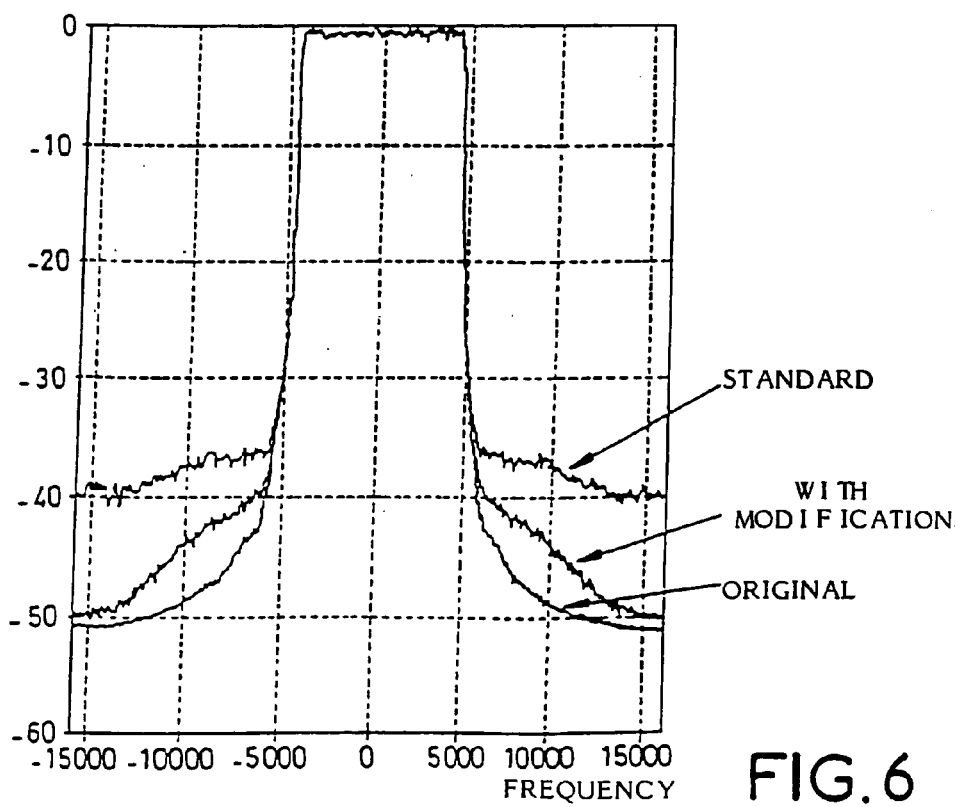

Other characteristics and advantages of the invention will become clear after reading the following description with reference to the attached drawings that represent:

FIG. 1 shows the principle used in the invention to transform a transmitter transmitting in amplitude modulation into a transmitter transmitting digital signals, FIG. 2 is a graph representing a signal transmission with several amplitude and phase states, by a transmitter according to that shown in FIG. 1, FIG. 3 shows an embodiment of a transmitter according to the invention, FIG. 4 contains graphs describing the amplitude of the output from the exciter used in the invention, and the amplitudes of the modulator output voltage and the voltage applied to the anode of the output tube as a function of the amplitude of the signal to be transmitted, FIGS. 5 and 6 of the amplitude and phase spectra of the signal obtained at the output from a transmitter conform with that shown in FIG. 3.

DETAILED DESCRIPTION OF THE INVENTION

The transmitter shown in FIG. 1 comprises a power tube 1, the grid of which is excited by an excitation device 2, and the anode of which is modulated in amplitude by a modulator 3. A control device 4 generates the signals necessary for phase control of the excitation device 2 and amplitude control of the modulator 3 starting from the real component I(t) and the imaginary component Q(t) of the complex signal to be transmitted.

Phase modulation of the grid of tube 1 is achieved starting from the sine and cosine of the phase angle $\phi$ calculated by the conversion device 4 and applied to the first operand inputs of the multiplier circuits 6 and 7. Second operand inputs of the multiplier circuits 6 and 7 also receive two sinusoidal signals with constant amplitude and with a frequency equal to the frequency supplied by the synthesizer 5, but for which the phases can be shifted by 90° with respect to each other. An adder circuit 8 adds signals obtained at the output from the two multiplier circuits 6 and 7 to apply a signal $S(t)=\exp(j\phi 1)$ to the grid of tube 1 through the exciter 2, where $\phi 1=\phi+\omega t$, and $\omega=2\pi f$, where f is the frequency of the synthesizer 5.

The amplitude modulation of the anode of tube 1 is obtained by applying a signal $A_1$ proportional to the modulus of the complex signal to be transmitted through modulator 3, defined by the relation:

$$A_1 = (I_{(t)}^2 + Q_{(t)}^2)^{1/2}$$

Considering linear amplification of tube 1 in an ideal case, the combined action of the excitation device 2 and the modulator 3 must produce a signal $S_1(t)$ defined by the following relation on the anode of tube 1:

$$S_1(t) = A_1 S(t)$$

The signal $S_1(t)$ is then applied to a transmission antenna 9 through a matching device and coupling device 10.

However in practice, the signal obtained on the anode of tube 1 has large distortions particularly due to low amplitudes compared with the signal applied to the transmitter input. This is partly due to non-linearity of the amplification curve of tube 1 that is polarized in class C and the fact that the excitation device and tube 1 both act like switches in order to obtain a very good efficiency. The signal phase varies most quickly at low amplitudes close to zero values of the imaginary parts I and Q of the complex signal to be transmitted, which makes it necessary to have a very wide pass band of the phase modulated channel. It is also close to the origin that the amplitude modulation of the tube has the largest number of sharp direction changes which also require a wide passband of the amplitude channel, typically at least three times the band width of the transmitted signal.

Furthermore, parasite capacitances between the anode and the grid of the power tube introduce an additional phase shift that depends on the output amplitude from the power tube 1. The result is distortions like those shown in FIG. 2, in the case of a transmission of a complex signal with several regularly spaced amplitude and phase states.

In order to solve these difficulties, the transmission device shown in FIG. 3 behaves like the device shown in FIG. 1 in which corresponding elements are shown with the same references, a power tube 1 for which the grid is excited by an excitation device 2 and for which the anode is modulated in amplitude by a modulator 3. The excitation device 2 and the modulator 3 are controlled by a control device 4. The only difference between the transmission device shown in FIG. 3 and the transmission device shown in FIG. 1 is the excitation device 2 for which the characteristic is practically linear at low level of the signal to be transmitted and operates in saturation for higher levels, the polarization of the tube 1 and the presence of a complex local demodulator composed of two multiplier circuits 11 and 12 coupled to the transmitter output to estimate the components $I_e(t)$ and $Q_e(t)$ of the transmitted signal, and by the presence of a signal processor, not shown, arranged on the inside the control device 4 to control the excitation device 2 as a function of the result that it obtains by comparing the real and imaginary amplitudes respectively of the signal to be transmitted and of the signal actually transmitted to slave the transmitted signal to the signal to be transmitted applied to the input of the transmitter. Depending on this result, the control device 4 firstly outputs the real part $I_m$ and the imaginary part $Q_m$ of a complex signal $I_m + j\, Q_m$ to the operand input of two multiplier circuits 6 and 7, and secondly applies a signal A(t) representing its modulus at the input of the modulator 3.

In these calculations, the amplitude A(t) of the signal applied to the input of modulator 3 is determined by a relation in the following form:

$$A(t) = (A_0^{2n} + (I_m^2 + Q_m^2)^n)^{1/2n}$$

For n=1 A(t) becomes $$A(t) = (A_0^2 + (I_m^2 + Q_m^2)^n)^{1/2}$$

and the phase angle $\phi$ is determined by the relation $$e^{j\phi} = (I_m + j\, Q_m)(I_m^2 + Q_m^2)$$

The control device 4 also determines a signal X polarizing the grid of tube 1 that is determined as a function of the amplitude of the complex signal $I_d(t) + Q_d(t)$ of the signal to be transmitted.

FIG. 4 shows the amplitude h(A) of the signal obtained at the output from the excitation device 2, the amplitude g(A) of the modulation signal applied to the anode of the power tube 1, and the amplitude X=f(a) representative of the polarization voltage of the grid of tube 1, as a function of the amplitude A(t) of the signal to be transmitted. For low modulation signal amplitudes A(t), the grid polarization is positive and the anode polarization is close to $A_0$ which makes the power tube 1 conducting, whereas for modulation signal amplitudes greater than a determined threshold value, the polarization voltage of the grid becomes negative and the power tube then operates in a switching condition at the modulation rate.

The effect of this is that as soon as the anode voltage exceeds a determined value, the efficiency of the transmitter is very high and for amplitudes below this value, the efficiency of the transmitter is authorized to have correspondingly low values when the amplitude of the output signal itself is low, which is not annoying since in this case the consumed power is low.

The curve shown in a bold line represents the amplitude at the transmitter output.

The impact on the amplitude and phase of the signal spectrum is shown in FIGS. 5 and 6.

The invention claimed is:

1. A digital radio broadcasting transmitter, comprising:
   a power tube including a grid and an anode;
   an excitation device configured to excite the grid using a variable phase signal; and
   a modulator configured to modulate the anode using a variable amplitude signal,
   wherein a signal applied to the grid and anode of the power tube has a phase and an amplitude respectively represented by a phase and an amplitude of a complex signal to be transmitted, and
   wherein the excitation device has a linear amplification characteristic for low amplitudes of the complex signal to be transmitted and operates under saturated conditions when the amplitude of the complex signal to be transmitted exceeds a determined threshold value, so that the amplification characteristic of the digital radio broadcasting transmitter as a whole remains linear independently of the amplitude of the complex signal to be transmitted.

2. The digital radio broadcasting transmitter of claim 1, further comprising:
   a control device configured to apply a low and approximately constant polarization voltage to the anode of the power tube when the amplitude of the complex signal to be transmitted is below the determined threshold value and to modulate the anode voltage proportionally to a modulus of the complex signal to be transmitted when the amplitude of the complex signal to be transmitted is higher than the determined threshold value.

3. The digital radio broadcasting transmitter of claim 1, wherein the power tube operates in linear amplification mode when the amplitude of the complex signal to be transmitted is below the determined threshold value and operates as a switch when the amplitude of the complex signal to be transmitted is higher than the determined threshold value.

4. The digital radio broadcasting transmitter of claim 2, wherein the power tube operates in linear amplification mode when the amplitude of the complex signal to be transmitted is below the determined threshold value and operates as a switch when the amplitude of the complex signal to be transmitted is higher than the determined threshold value.

5. A radio transmitter, comprising:
   a control device configured to generate at least two phase control signals and at least one amplitude control signal using a real component and an imaginary component of a complex signal to be transmitted;
   a frequency synthesizer configured to generate at least two constant signals with constant amplitude and frequency;
   at least two multiplier circuits arranged in correspondence with the at least two phase control signals and the at least two constant signals, each multiplier circuit comprising at least two operand inputs and being configured to generate at least one transformed phase control signal;
   an adder circuit configured to generate a signal equal to the sum of transformed phase control signals generated by the at least two multiplier circuits;
   an excitation device configured to excite a grid of a power tube using the signal generated by the adder circuit in a linear amplification mode when the complex signal to be transmitted has an amplitude below a predetermined amplitude threshold and in a saturated mode when the complex signal to be transmitted has an amplitude above the predetermined amplitude threshold;
   a modulator configured to generate a modulated signal at an anode of the power tube using the at least one amplitude control signal generated by the control device; and
   a matching and coupling device configured to generate a matched and coupled signal using the modulated signal; and
   an antenna configured to transmit the matched and coupled signal.

6. The radio transmitter of claim 5, wherein the control device generates two sinusoidal phase control signals.

7. The radio transmitter of claim 6, wherein one of the two phase control signals is a sine of a phase angle of the complex signal to be transmitted and the other is a cosine of the phase angle of the complex signal to be transmitted.

8. The radio transmitter of claim 5, wherein the amplitude control signal is proportional to a modulus of the complex signal to be transmitted.

9. The radio transmitter of claim 5, wherein the frequency synthesizer synthesizes two constant signals having frequencies that are identical and phases that are shifted by 90 degrees.

10. The radio transmitter of claim 5, further comprising:
    at least two demodulating multiplier circuits coupled to the signal transmitted by the antenna, arranged in correspondence with the at least two constant signals, and configured to generate an estimated real component and an estimated imaginary component of the signal transmitted by the antenna, each demodulating multiplier circuit comprising at least two inputs.

11. The radio transmitter of claim 10, wherein the control device comprises a signal processor configured to control the excitation device by comparing the estimated real and imaginary components generated by the at least two demodulating multiplier circuits and the real and imaginary components of the complex signal to be transmitted.

12. The radio transmitter of claim 11, wherein the control device first applies to operand inputs of the multiplier circuits the real and imaginary components of the complex signal to be transmitted and then applies the amplitude control signal to the modulator.

13. The radio transmitter of claim 5, wherein the control device determines a polarizing signal as a function of an amplitude of the complex signal to be transmitted to polarize the grid of the power tube.

14. The radio transmitter of claim 13, further comprising:
    at least two demodulating multiplier circuits coupled to the signal transmitted by the antenna, arranged in correspondence with the at least two constant signals, and configured to generate an estimated real component and an estimated imaginary component of the signal transmitted by the antenna, each demodulating multiplier circuit comprising at least two inputs.

15. The radio transmitter of claim 14, wherein the control device comprises a signal processor configured to control the excitation device by comparing the estimated real and imaginary components generated by the at least two demodulating multiplier circuits and the real and imaginary components of the complex signal to be transmitted.

16. The radio transmitter of claim 15, wherein the control device first applies to operand inputs of the multiplier circuits the real and imaginary components of the complex signal to be transmitted and then applies the amplitude control signal to the modulator.

17. The radio transmitter of claim 16, wherein the control device generates two sinusoidal phase control signals.

18. The radio transmitter of claim 17, wherein one of the two phase control signals is a sine of a phase angle of the complex signal to be transmitted and the other is a cosine of the phase angle of the complex signal to be transmitted.

19. The radio transmitter of claim 18, wherein the amplitude control signal is proportional to a modulus of the complex signal to be transmitted.

20. The radio transmitter of claim 19, wherein the frequency synthesizer synthesizes two constant signals having frequencies that are identical and phases that are shifted by 90 degrees.

* * * * *